(12) United States Patent
Koui et al.

(10) Patent No.: US 10,902,900 B2
(45) Date of Patent: Jan. 26, 2021

(54) MAGNETIC MEMORY DEVICE

(71) Applicant: KABUSHIKI KAISHA TOSHIBA, Tokyo (JP)

(72) Inventors: Katsuhiko Koui, Kanagawa (JP); Hiroaki Yoda, Kanagawa (JP); Tomoaki Inokuchi, Kanagawa (JP); Naoharu Shimomura, Tokyo (JP); Hideyuki Sugiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/351,745

(22) Filed: Mar. 13, 2019

(65) Prior Publication Data
US 2020/0090718 A1 Mar. 19, 2020

(30) Foreign Application Priority Data
Sep. 13, 2018 (JP) .................. 2018-171932

(51) Int. Cl.
*H01L 43/08* (2006.01)
*H01L 43/10* (2006.01)
(Continued)

(52) U.S. Cl.
CPC .......... *G11C 11/161* (2013.01); *H01L 27/226* (2013.01); *H01L 43/08* (2013.01); *H01L 43/10* (2013.01)

(58) Field of Classification Search
CPC ....... H01L 43/08; H01L 41/12; H01L 27/226; H01L 27/222; H01L 27/20; G11C 11/161; G11C 11/1675
USPC ................. 257/421, 295, 252, 200, E21.665, 257/E27.005, E27.006, E43.002, E43.004, 257/E43.006; 360/324, 324.1, 324.11, 360/324.12, 324.2; 365/158, 173, 171, 365/210.1; 438/3, 692, 706
See application file for complete search history.

(56) References Cited

U.S. PATENT DOCUMENTS 6,275,363 B1 * 8/2001 Gill .................. B82Y 10/00
                                                  360/324.2
7,630,232 B2 * 12/2009 Guo ................. B82Y 25/00
                                                  365/158
(Continued)

FOREIGN PATENT DOCUMENTS

JP        2017-59594        3/2017

OTHER PUBLICATIONS

Yiran Chen et al., Access Scheme of Multi-Level Cell Spin-Transfer Torque Random Access Memory and Its Optimization; IEEE 2010; pp. 1109-1112.

*Primary Examiner* — Dao H Nguyen
(74) *Attorney, Agent, or Firm* — Finnegan, Henderson, Farabow, Garrett & Dunner, L.L.P.

(57) ABSTRACT

A magnetic memory device includes a conductive member, a stacked body, and a controller. The stacked body includes a first magnetic layer, a second magnetic layer provided between the conductive member and the first magnetic layer, and a third magnetic layer stacked with the first magnetic layer and the second magnetic layer. The controller causes a current to flow in the conductive member. The controller causes a current to flow between the conductive member and the stacked body. The controller is able to identify three or more levels of an electrical resistance value of the stacked body.

14 Claims, 10 Drawing Sheets

(51) Int. Cl.
*H01L 27/22* (2006.01)
*G11C 11/16* (2006.01)

(56) References Cited

U.S. PATENT DOCUMENTS

| | | | |
|---|---|---|---|
| 8,351,163 B2* | 1/2013 | Sakamoto | B82Y 10/00 29/603.08 |
| 2002/0051380 A1* | 5/2002 | Kamiguchi | B82Y 10/00 365/158 |
| 2002/0126428 A1* | 9/2002 | Gill | B82Y 10/00 360/324.12 |
| 2007/0086121 A1* | 4/2007 | Nagase | H01L 43/08 360/324.1 |
| 2007/0177420 A1* | 8/2007 | Guo | B82Y 25/00 365/158 |
| 2009/0091864 A1* | 4/2009 | Carey | B82Y 25/00 360/324.11 |
| 2017/0076769 A1 | 3/2017 | Shirotori et al. | |
| 2020/0006625 A1* | 1/2020 | Oguz | H01F 10/3254 |

* cited by examiner

MAGNETIC MEMORY DEVICE

CROSS-REFERENCE TO RELATED APPLICATIONS

This application is based upon and claims the benefit of priority from Japanese Patent Application No. 2018-171932, filed on Sep. 13, 2018; the entire contents of which are incorporated herein by reference.

FIELD

Embodiments relate to a magnetic memory device.

BACKGROUND

It is desirable to increase the storage density of a magnetic memory device.

DETAILED DESCRIPTION

Figure 1A:
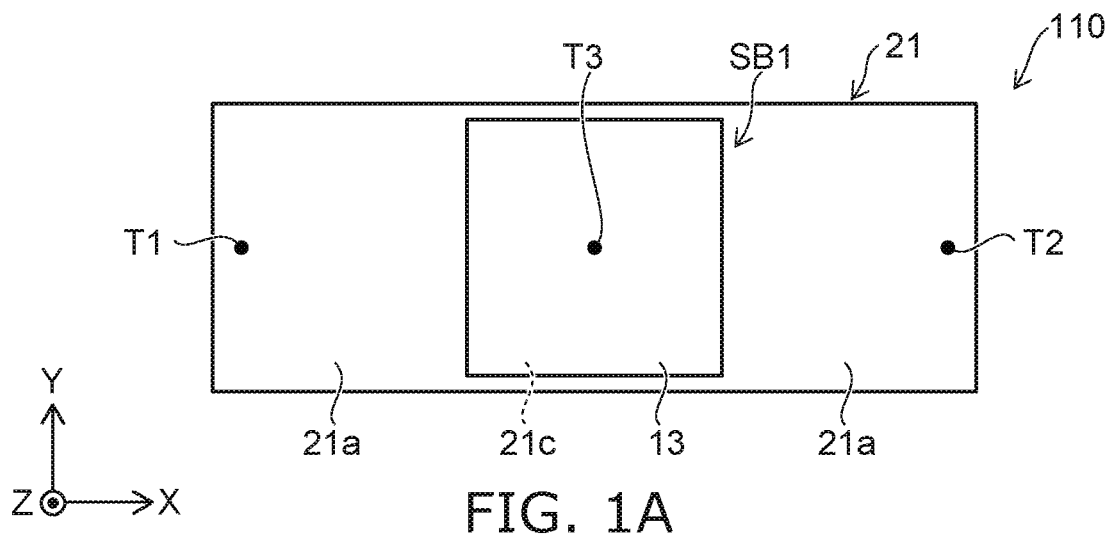
FIG. 1A is a plan view showing a magnetic memory device according to a first embodiment.

A magnetic memory device according to an embodiment includes a conductive member, a stacked body, and a controller. The stacked body includes a first magnetic layer, a second magnetic layer provided between the conductive member and the first magnetic layer, and a third magnetic layer stacked with the first magnetic layer and the second magnetic layer. The controller causes a current to flow in the conductive member. The controller causes a current to flow between the conductive member and the stacked body. The controller is able to identify three or more levels of an electrical resistance value of the stacked body.

Embodiments will now be described with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
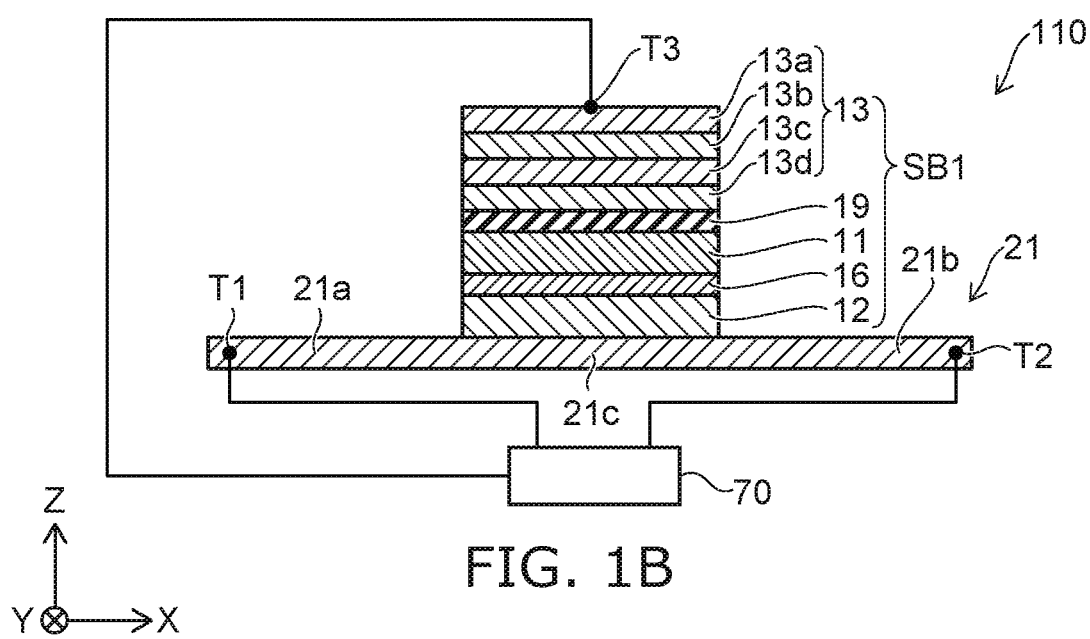
FIG. 1B is a cross-sectional view of the magnetic memory device.

FIG. 1A is a plan view showing a magnetic memory device according to the embodiment; and FIG. 1B is a cross-sectional view of the magnetic memory device.

As shown in FIGS. 1A and 1B, the magnetic memory device 110 according to the embodiment includes a first conductive layer 21, a first stacked body SB1, and a controller 70.

The first conductive layer 21 is, for example, a conductive member having an interconnect configuration and includes a first region 21a, a second region 21b, and a third region 21c. The third region 21c is provided between the first region 21a and the second region 21b. These regions are continuous with each other. The first region 21a is connected to a first terminal T1. The second region 21b is connected to a second terminal T2. Accordingly, the third region 21c is provided between the first terminal T1 and the second terminal T2. Hereinbelow, the direction from the first region 21a toward the second region 21b is called an "X-direction."

The first stacked body SB1 includes a first magnetic layer 11, a second magnetic layer 12, a third magnetic layer 13, a first nonmagnetic layer 16, and a first insulating layer 19. In the first stacked body SB1, the second magnetic layer 12, the first nonmagnetic layer 16, the first magnetic layer 11, the first insulating layer 19, and the third magnetic layer 13 are stacked in this order along the direction away from the first conductive layer 21. Hereinbelow, the stacking direction is called a "Z-direction." The Z-direction is orthogonal to the X-direction. A direction orthogonal to the X-direction and the Z-direction is called a "Y-direction."

The layer structure of the first stacked body SB1 will now be described in more detail.

In the Z-direction, the second magnetic layer 12, the first nonmagnetic layer 16, the first magnetic layer 11, and the first insulating layer 19 are provided between the first conductive layer 21 and the third magnetic layer 13. The second magnetic layer 12, the first nonmagnetic layer 16, and the first magnetic layer 11 are provided between the first conductive layer 21 and the first insulating layer 19. The second magnetic layer 12 and the first nonmagnetic layer 16 are provided between the first conductive layer 21 and the first magnetic layer 11. The second magnetic layer 12 is provided between the first conductive layer 21 and the first nonmagnetic layer 16. The second magnetic layer 12 contacts the third region 21c of the first conductive layer 21. The first nonmagnetic layer 16 is provided between the second magnetic layer 12 and the first magnetic layer 11. The surface of the third magnetic layer 13 on the side opposite to the first insulating layer 19 is connected to a third terminal T3. Thereby, the stacked body SB1 is connected between the first conductive layer 21 and the third terminal T3.

The configuration of the first conductive layer 21 is, for example, a band configuration extending in the X-direction. The configurations of the first magnetic layer 11, the second magnetic layer 12, the third magnetic layer 13, the first nonmagnetic layer 16, and the first insulating layer 19 are, for example, layer configurations. Viewed from the Z-direction, the configurations of these layers are rectangular or elliptical, e.g., square or circular.

Examples of the materials of the components will now be described.

The first conductive layer 21 includes, for example, a metal such as tantalum (Ta), tungsten (W), etc. The first magnetic layer 11 and the second magnetic layer 12 include at least one type of metal selected from the group consisting of iron (Fe), cobalt (Co), and nickel (Ni). For example, one of the first magnetic layer 11 or the second magnetic layer 12 is made of a material having negative magnetostriction; and the other is made of a material having positive magnetostriction. The material having negative magnetostriction includes, for example, a cobalt-rich iron-cobalt alloy (CoFe) having a fcc structure; and the material having positive magnetostriction includes, for example, an iron-cobalt alloy (FeCo) having a bcc structure.

The first nonmagnetic layer 16 includes at least one type of metal selected from the group consisting of ruthenium (Ru), iridium (Ir), chrome (Cr), and rhodium (Rh) and is made of, for example, ruthenium.

The third magnetic layer 13 includes, for example, a ferromagnet layer 13d, a nonmagnetic layer 13c, a ferromagnet layer 13b, and an antiferromagnet layer 13a. The ferromagnet layer 13d, the nonmagnetic layer 13c, the ferromagnet layer 13b, and the antiferromagnet layer 13a are stacked in this order along the direction away from the first insulating layer 19.

The ferromagnet layer 13d includes, for example, a ferromagnet or an alloy of the ferromagnet; the ferromagnet includes an Fe—Co alloy as a major component; and the alloy includes the ferromagnet and at least one type of component selected from the group consisting of boron (B), silicon (Si), aluminum (Al), germanium (Ge), gallium (Ga), and carbon (C). The nonmagnetic layer 13c includes at least one type of metal selected from the group consisting of ruthenium, iridium, chrome, and rhodium and is made of, for example, ruthenium. The ferromagnet layer 13b includes a ferromagnet having a Co—Fe alloy as a major component. The antiferromagnet layer 13a includes an alloy including manganese (Mn) and at least one type of metal selected from the group consisting of iridium, rhodium, platinum (Pt), and iron.

The controller 70 causes a current to flow between the first terminal T1 and the second terminal T2. Also, the controller 70 causes a current to flow between the first terminal T1 and the third terminal T3. The controller 70 also measures the electrical resistance value between the first terminal T1 and the third terminal T3, i.e., the electrical resistance value along the stacking direction of the first stacked body SB1 (the Z-direction). The controller 70 can identify three or more levels, e.g., four levels.

Operations of the embodiment will now be described.

In the first stacked body SB1, the first magnetic layer 11 and the second magnetic layer 12 are, for example, free magnetic layers and function as memory layers. The third magnetic layer 13 is, for example, a fixed magnetic layer and functions as a reference layer. Thereby, the first stacked body SB1 functions as, for example, a magnetic variable resistance element and functions as, for example, a MTJ (Magnetic Tunnel Junction) element. For example, a TMR (Tunneling Magnetoresistance Effect) occurs in the first stacked body SB1. As a result, the first stacked body SB1 functions as one memory cell.

More specifically, when the controller 70 causes a current to flow between the first terminal T1 and the second terminal T2 and causes a current to flow between the first terminal T1 and the third terminal T3, the electrical resistance value between the third terminal T3 and the first terminal T1 for the first stacked body SB1 changes according to the orientations and the magnitudes of these currents. The electrical resistance value changes between four levels; and the controller 70 can identify the four levels. As a result, quaternary data can be stored in the first stacked body SB1.

Although the principle of the electrical resistance value of the first stacked body SB1 changing between the four levels is not exactly clear, the principle is inferred to be as follows.

FIGS. 2A to 2D are schematic views showing operations of the magnetic memory device according to the embodiment.

Figure 2A:
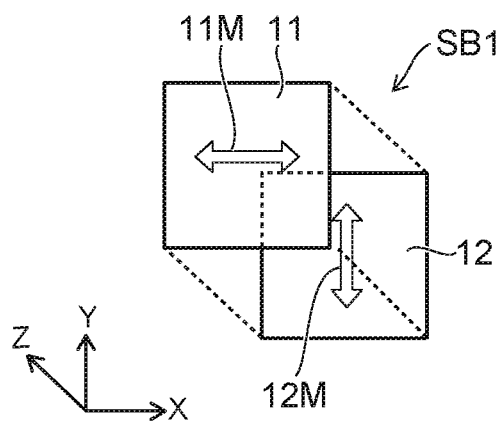
FIGS. 2A to 2D are schematic views showing operations of the magnetic memory device according to the first embodiment.

As shown in FIG. 2A, the second magnetic layer 12 is formed of a material having negative magnetostriction, e.g., a cobalt-rich iron-cobalt alloy (CoFe) having a fcc structure; and the first magnetic layer 11 is formed of a material having positive magnetostriction, e.g., an iron-cobalt alloy (FeCo) having a bcc structure. Then, a tensile force is applied to the stacked body SB1 along the X-direction. Thereby, a magnetization direction 12M of the second magnetic layer 12 made of the material having negative magnetostriction is easily aligned with the Y-direction. On the other hand, a magnetization direction 11M of the first magnetic layer 11 made of the material having positive magnetostriction is easily aligned with the X-direction. The second magnetic layer 12 and the first magnetic layer 11 are antiferromagnetically coupled via the first nonmagnetic layer 16 made of ruthenium (referring to FIG. 1B).

Figure 2B:
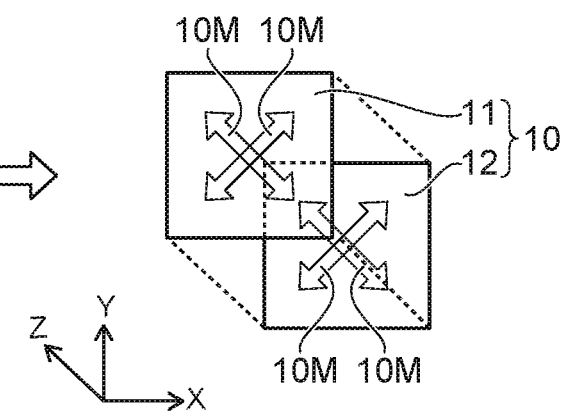

As a result, as shown in FIG. 2B, a magnetization direction 10M of the entirety of a multilayer memory layer 10, i.e., the stacked body made of the second magnetic layer 12 and the first magnetic layer 11, is easily aligned with a direction between the magnetization direction 12M and the magnetization direction 11M, i.e., a direction tilted 45° with respect to the X-direction and the Y-direction in the XY plane.

Figure 2C:
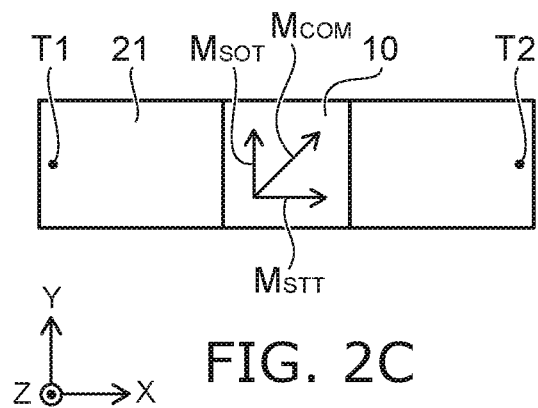

As shown in FIG. 2C, the controller 70 (referring to FIG. 1B) controls the potentials applied to the first terminal T1, the second terminal T2, and the third terminal T3 in this state; a current flows in the forward direction or the reverse direction between the first terminal T1 and the second terminal T2; and a current flows in the forward direction or the reverse direction between the first terminal T1 and the third terminal T3. The current that flows between the first terminal T1 and the second terminal T2 generates a magnetic field $M_{SOT}$ along the Y-direction inside the multilayer memory layer 10 due to the spin-orbit torque (SOT) effect due to the current flowing along the X-direction through the first conductive layer 21. Also, the current that flows between the first terminal T1 and the third terminal T3 generates a magnetic field $M_{STT}$ along the X-direction due to the spin torque transfer (STT) effect due to the current flowing along the Z-direction through the first stacked body SB1. A combined magnetic field $M_{COM}$ of the magnetic field $M_{SOT}$ and the magnetic field $M_{STT}$ is generated thereby.

Figure 2D:
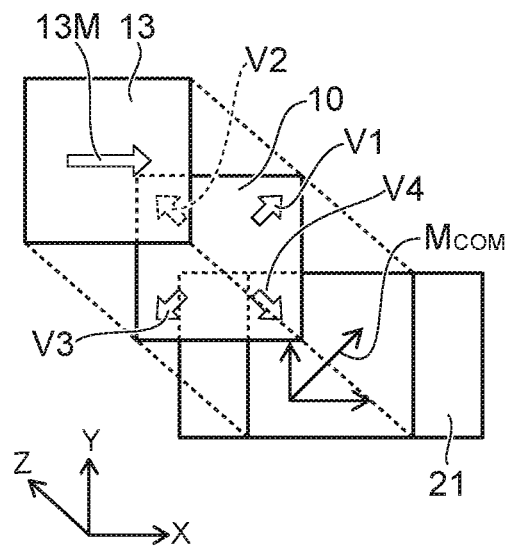
Figure 3A:
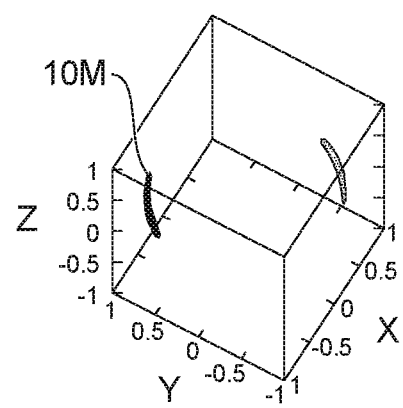
FIGS. 3A to 3D show simulation results of the first embodiment.
Figure 3B:
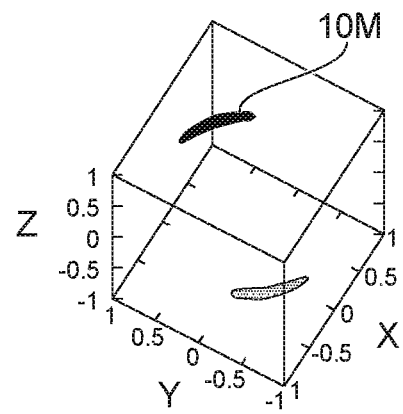
Figure 3C:
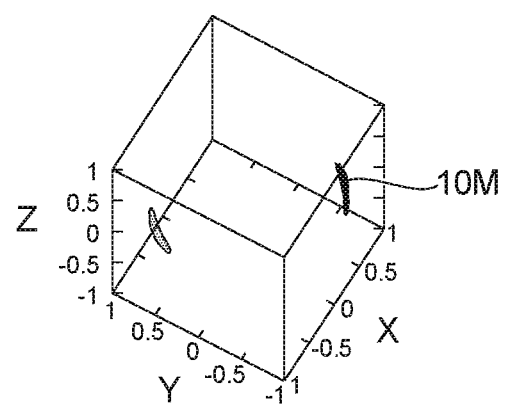
Figure 3D:
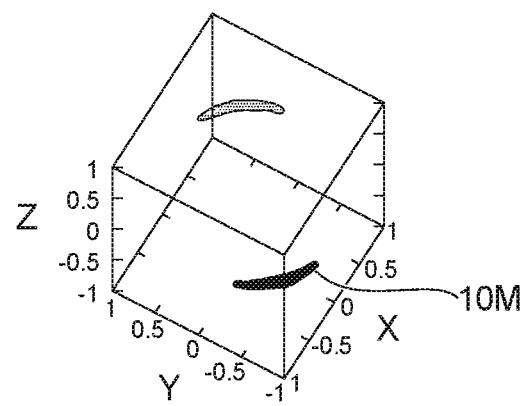

As a result, due to the combined magnetic field $M_{COM}$ as shown in FIG. 2D, the magnetization direction 10M of the multilayer memory layer 10 easily can be in the four directions of a direction V1 between the +X direction and the +Y direction, a direction V2 between the +Y direction and the −X direction, a direction V3 between the −X direction and the −Y direction, and a direction V4 between the −Y direction and the +X direction. On the other hand, a magnetization direction 13M of the third magnetic layer 13 which is the reference layer is taken to be a direction shifted slightly from the X-direction. Therefore, the electrical resistance value along the Z-direction of the first stacked body SB1 is separated into four levels by the interaction between the magnetization direction 10M and the magnetization direction 13M of the third magnetic layer 13 according to the directions V1 to V4 that the magnetization direction 10M of the multilayer memory layer 10 is in.

Simulation results of the operations described above will now be described.

FIGS. 3A to 3D show the simulation results of the embodiment.

In the simulation shown in FIGS. 3A to 3D, for the first magnetic layer 11 and the second magnetic layer 12, the lengths in the X-direction were set to 60 nm (nanometers); the lengths in the Y-direction were set to 60 nm; the thicknesses, i.e., the lengths in the Z-direction were set to 2 nm; the saturation magnetizations were set to 1100 emu/cc; the induced magnetic anisotropies were set to 1 kOe in mutually-orthogonal directions; exchange interaction constants Jex were set to −0.2 erg/cm$^2$; and the distribution of the magnetization direction 10M was calculated for 10 ns (nanoseconds). The arc-like regions inside the drawings show the tips of the vectors showing the magnetization direction 10M; the black arc-like region shows the tip of the vector showing the magnetization direction 10M of the first magnetic layer 11; and the gray arc-like region shows the tip of the vector showing the magnetization direction 10M of the second magnetic layer 12. According to the simulation as shown in FIGS. 3A to 3D, the magnetization direction 10M of the multilayer memory layer 10 can be divided into four directions.

According to the embodiment as described above, for example, quaternary data can be stored in the first stacked body SB1 included in one memory cell. Therefore, for example, the storage density of the magnetic memory device 110 according to the embodiment can be increased.

Modification of First Embodiment

Figure 4A:
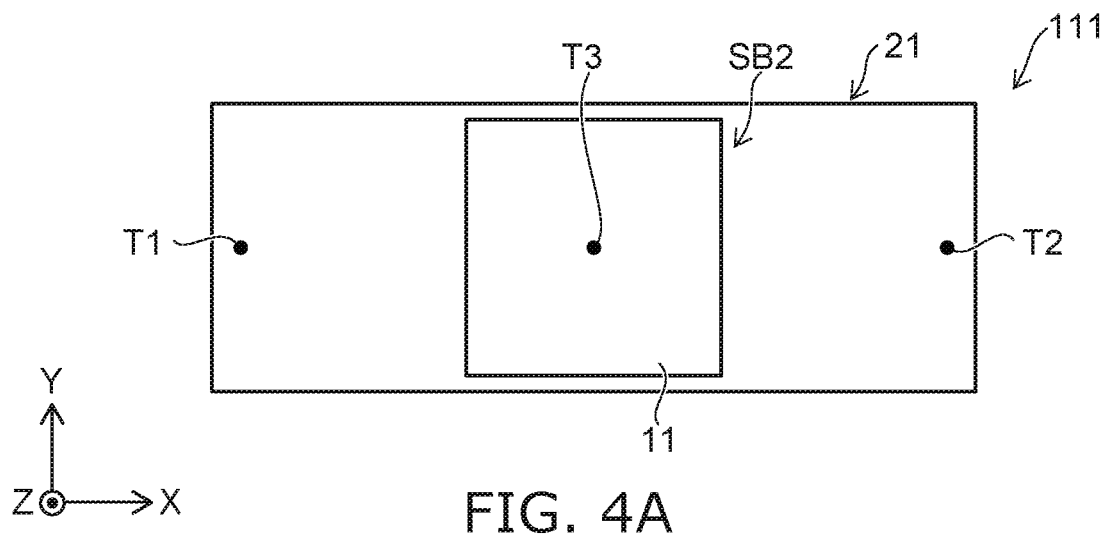
FIG. 4A is a plan view showing a magnetic memory device according to a modification of the first embodiment.
Figure 4B:
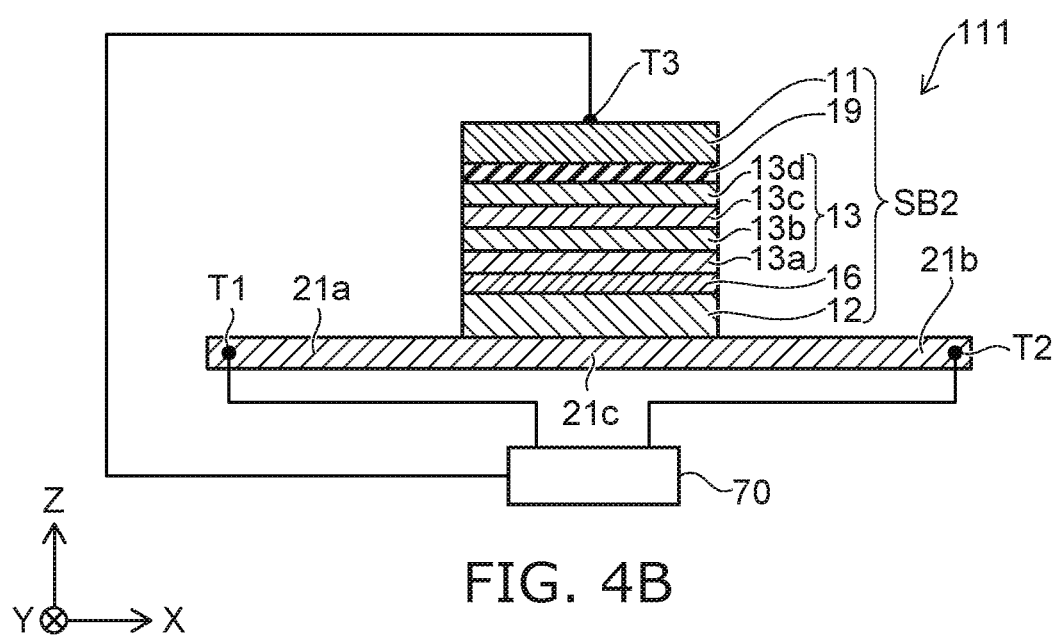
FIG. 4B is a cross-sectional view of the magnetic memory device.

FIG. 4A is a plan view showing a magnetic memory device according to the modification; and FIG. 4B is a cross-sectional view of the magnetic memory device.

As shown in FIGS. 4A and 4B, compared to the magnetic memory device 110 according to the first embodiment described above (referring to FIGS. 1A and 1B), a second stacked body SB2 is provided instead of the first stacked body SB1 in the magnetic memory device 111 according to the modification. Compared to the first stacked body SB1, the position of the third magnetic layer 13 is different in the second stacked body SB2.

In the second stacked body SB2, the third magnetic layer 13 which is the reference layer is provided between the first magnetic layer 11 and the second magnetic layer 12 which are the memory layers. The first insulating layer 19 is provided between the first magnetic layer 11 and the third magnetic layer 13. In other words, in the second stacked body SB2, the second magnetic layer 12, the first nonmagnetic layer 16, the third magnetic layer 13, the first insulating layer 19, and the first magnetic layer 11 are stacked in this order along the Z-direction in order from the first conductive layer 21 side. The second magnetic layer 12 contacts the first conductive layer 21. The first magnetic layer 11 is connected to the third terminal T3. The first nonmagnetic layer 16 may include at least one type of metal selected from the group consisting of ruthenium, iridium, chrome, rhodium, tantalum, tungsten, and molybdenum (Mo). The first nonmagnetic layer 16 is a nonmagnetic metal layer for suppressing the magnetic interference between the second magnetic layer 12 and the third magnetic layer 13.

The third magnetic layer 13 includes, for example, the ferromagnet layer 13d, the nonmagnetic layer 13c, the ferromagnet layer 13b, and the antiferromagnet layer 13a. The ferromagnet layer 13d, the nonmagnetic layer 13c, the ferromagnet layer 13b, and the antiferromagnet layer 13a are stacked in this order along the direction from the first magnetic layer 11 toward the second magnetic layer 12. The compositions of each layer are similar to those of the first embodiment.

Figure 5:
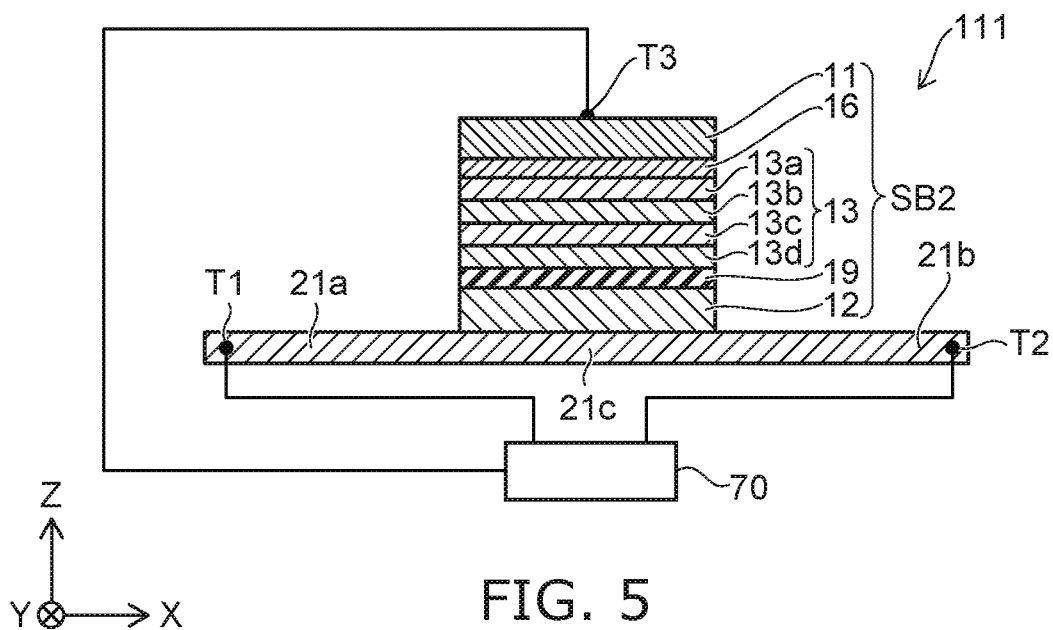
FIG. 5 is a cross-sectional view showing another configuration of a second stacked body of the modification of the first embodiment.

FIG. 5 is a cross-sectional view showing another configuration of the second stacked body SB2 of the modification.

In the second stacked body SB2 as shown in FIG. 5, the second magnetic layer 12, the first insulating layer 19, the third magnetic layer 13, the first nonmagnetic layer 16, and the first magnetic layer 11 are stacked in this order along the Z-direction in order from the first conductive layer 21 side. In the third magnetic layer 13, the ferromagnet layer 13d, the nonmagnetic layer 13c, the ferromagnet layer 13b, and the antiferromagnet layer 13a are stacked in this order along the direction from the second magnetic layer 12 toward the first magnetic layer 11.

Otherwise, the configuration and the operations of the modification are similar to those of the first embodiment described above.

Second Embodiment

Figure 6:
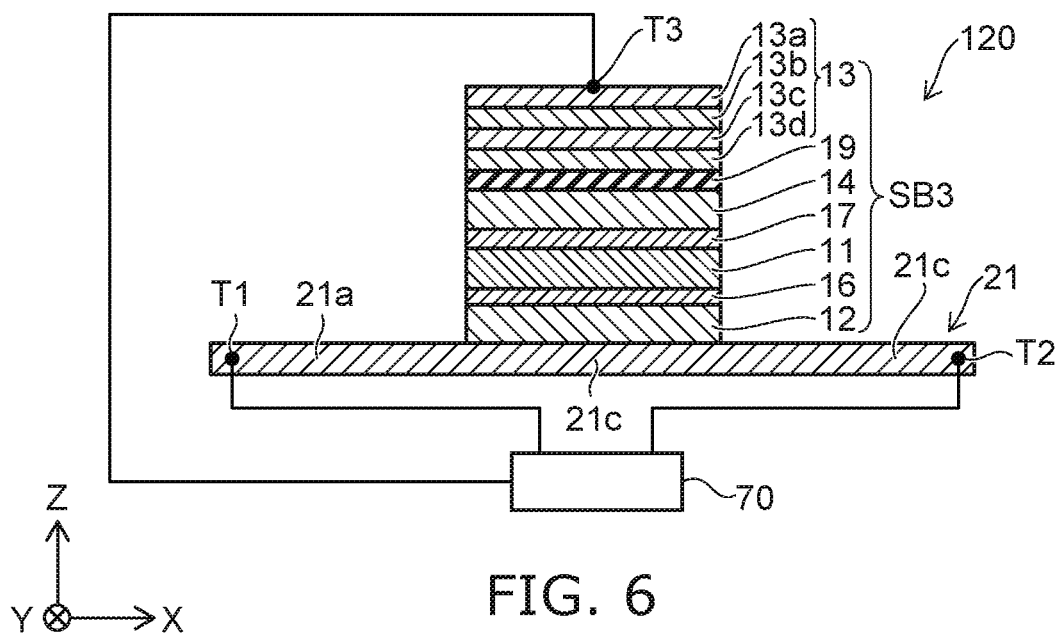
FIG. 6 is a cross-sectional view showing a magnetic memory device according to a second embodiment.

FIG. 6 is a cross-sectional view showing a magnetic memory device according to the embodiment.

In the magnetic memory device 120 according to the embodiment as shown in FIG. 6, a fourth magnetic layer 14 and a second nonmagnetic layer 17 are provided in addition to the configuration of the magnetic memory device 110 according to the first embodiment described above (referring to FIGS. 1A and 1B).

In the embodiment, a third stacked body SB3 is provided instead of the first stacked body SB1 of the first embodiment; in the third stacked body SB3, the fourth magnetic layer 14 is provided between the first magnetic layer 11 and the third magnetic layer 13; and the second nonmagnetic layer 17 is provided between the first magnetic layer 11 and the fourth magnetic layer 14. In other words, in the third stacked body SB3, the second magnetic layer 12, the first nonmagnetic layer 16, the first magnetic layer 11, the second nonmagnetic layer 17, the fourth magnetic layer 14, the first insulating layer 19, and the third magnetic layer 13 are stacked in this order along the Z-direction from the first conductive layer 21 side.

Operations of the embodiment will now be described.

In the third stacked body SB3, the fourth magnetic layer 14 is a free magnetic layer and functions as a memory layer. The controller 70 causes a current to flow between the first terminal T1 and the second terminal T2 and causes a current to flow between the first terminal T1 and the third terminal T3; and the electrical resistance value in the Z-direction of the third stacked body SB3 changes according to the orientations and the magnitudes of these currents. The electrical resistance value changes between five or more levels, e.g., eight levels; and the controller 70 can identify eight levels of electrical resistance values. As a result, octary data can be stored in the third stacked body SB3.

Thus, although the principle of the electrical resistance value of the third stacked body SB3 changing between the eight levels is not exactly clear, the principle is inferred to be as follows.

Figure 7A:
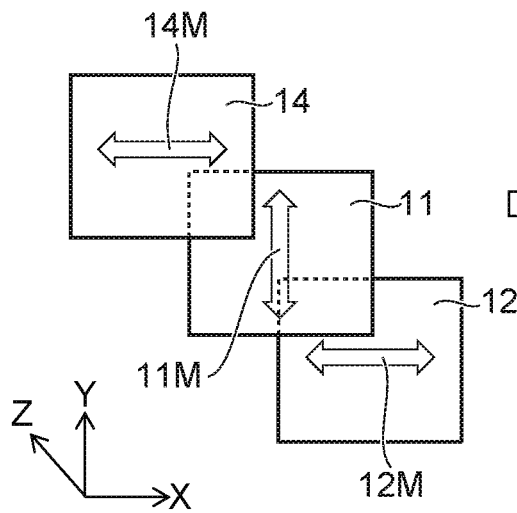
FIGS. 7A and 7B are schematic views showing operations of the magnetic memory device according to the second embodiment.
Figure 7B:
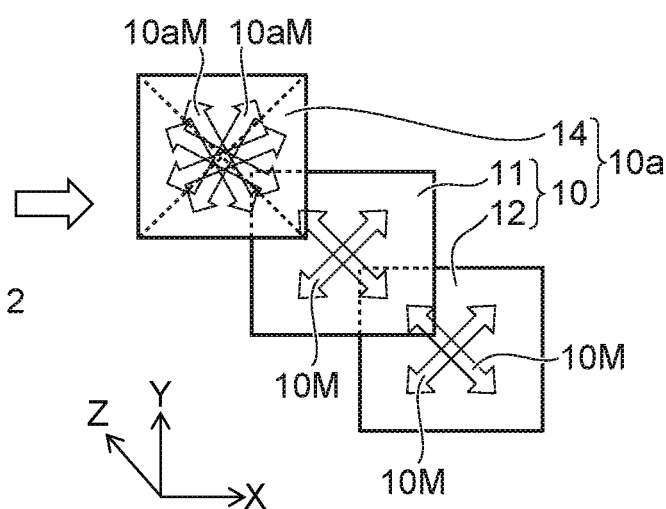

FIGS. 7A and 7B are schematic views showing the operations of the magnetic memory device according to the embodiment.

As shown in FIG. 7A, similarly to the first embodiment described above, the second magnetic layer 12 is formed of a material having negative magnetostriction; and the first magnetic layer 11 is formed of a material having positive magnetostriction. The fourth magnetic layer 14 is formed of a material having low magnetostriction, e.g., a cobalt-rich iron-cobalt alloy (CoFe), or is formed of a magnetic material in which a nonmagnetic additive is added to an iron-cobalt alloy and the saturation magnetization is reduced. Then, a tensile force is applied to the third stacked body SB3 along the X-direction. Thereby, the magnetization direction 12M of the second magnetic layer 12 made of the material having negative magnetostriction is easily aligned with the Y-direction. On the other hand, the magnetization direction 11M of the first magnetic layer 11 made of the material having positive magnetostriction is easily aligned with the X-direction.

As a result, as shown in FIG. 7B, the second magnetic layer 12 and the first magnetic layer 11 are antiferromagnetically coupled via the first nonmagnetic layer 16 made of ruthenium (referring to FIG. 6). Thereby, the magnetization direction 10M of the multilayer memory layer 10 made of the second magnetic layer 12 and the first magnetic layer 11 is easily aligned with a direction between the magnetization direction 12M and the magnetization direction 11M, i.e., a direction tilted 45° with respect to the X-direction and the Y-direction in the XY plane.

By adjusting the ruthenium film thickness so that the first magnetic layer 11 and the fourth magnetic layer 14 are ferromagnetically coupled, the four magnetization directions 10M of the multilayer memory layer 10 each are split into two by the competition between the ferromagnetic coupling and the antiferromagnetic coupling due to the magnetostatic coupling; and a magnetization direction 10aM of a multilayer memory layer 10a made of the second magnetic layer 12, the first magnetic layer 11, and the fourth magnetic layer 14 easily can be in a total of eight directions. As a result, the electrical resistance value along the Z-direction of the third stacked body SB3 is separated into eight levels by the interaction between the magnetization direction 10aM and the magnetization direction 13M of the third magnetic layer 13.

As described above, according to the embodiment, for example, octary data can be stored in the third stacked body SB3 included in one memory cell. Therefore, for example, the storage density of the magnetic memory device 120 according to the embodiment can be increased even more.

Otherwise, the configuration and the operations of the embodiment are similar to those of the first embodiment described above.

First Modification of Second Embodiment

Figure 8:
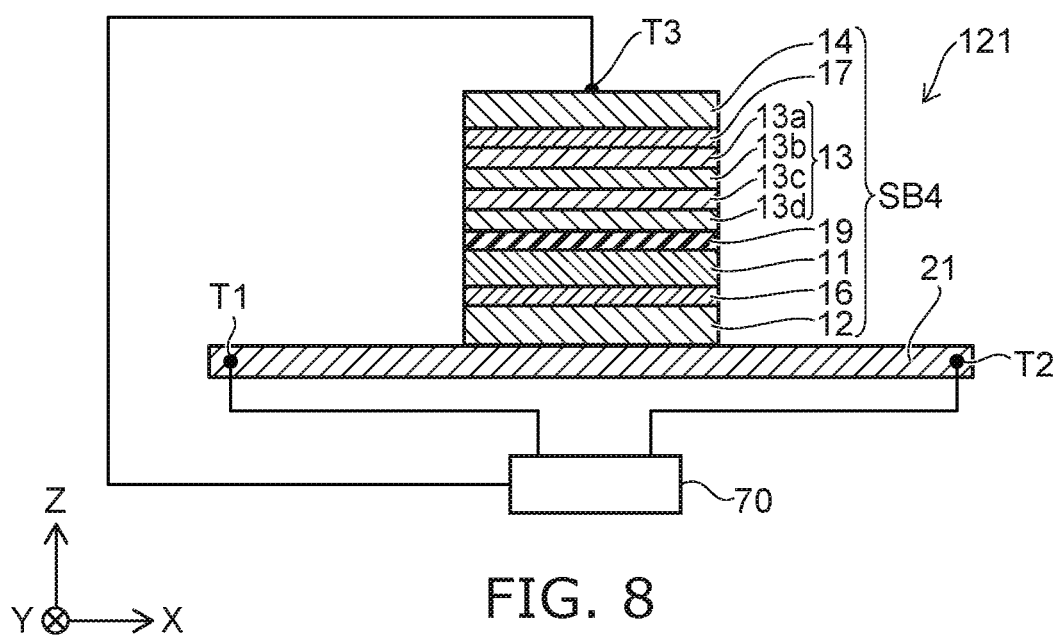
FIG. 8 is a cross-sectional view showing a magnetic memory device according to a first modification of the second embodiment.

FIG. 8 is a cross-sectional view showing a magnetic memory device according to the modification.

As shown in FIG. 8, compared to the magnetic memory device 120 according to the second embodiment described above (referring to FIG. 6), a fourth stacked body SB4 is provided instead of the third stacked body SB3 in the magnetic memory device 121 according to the modification. Compared to the third stacked body SB3, the position of the third magnetic layer 13 is different in the fourth stacked body SB4.

In the fourth stacked body SB4, the third magnetic layer 13 which is the reference layer is provided between the first magnetic layer 11 and the fourth magnetic layer 14 which are the memory layers. The second nonmagnetic layer 17 is provided between the third magnetic layer 13 and the fourth magnetic layer 14. The first insulating layer 19 is provided between the first magnetic layer 11 and the third magnetic layer 13. Accordingly, in the fourth stacked body SB4, the second magnetic layer 12, the first nonmagnetic layer 16, the first magnetic layer 11, the first insulating layer 19, the third magnetic layer 13, the second nonmagnetic layer 17, and the fourth magnetic layer 14 are stacked in this order along the Z-direction in order from the first conductive layer 21 side. The second magnetic layer 12 contacts the first conductive layer 21. The fourth magnetic layer 14 is connected to the third terminal T3. The configuration of the third magnetic layer 13 is similar to that of the first embodiment (referring to FIG. 1B).

Otherwise, the configuration and the operations of the modification are similar to those of the second embodiment.

Second Modification of Second Embodiment

Figure 9:
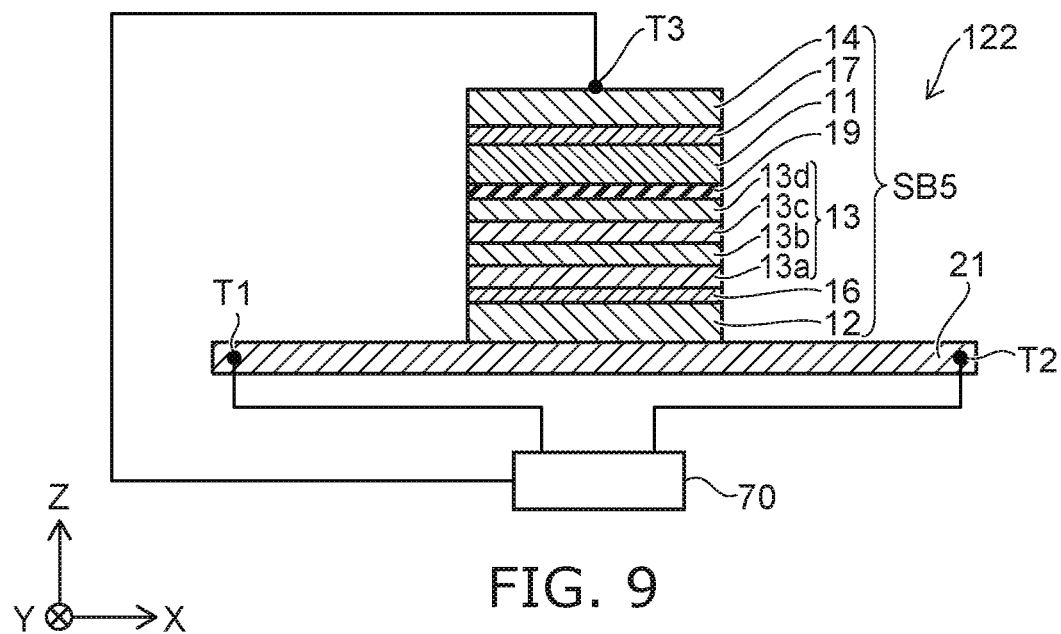
FIG. 9 is a cross-sectional view showing a magnetic memory device according to a second modification of the second embodiment.

FIG. 9 is a cross-sectional view showing a magnetic memory device according to the modification.

As shown in FIG. 9, compared to the magnetic memory device 120 according to the second embodiment described above (referring to FIG. 6), a fifth stacked body SB5 is provided instead of the third stacked body SB3 in the magnetic memory device 122 according to the modification. Compared to the third stacked body SB3, the position of the third magnetic layer 13 is different in the fifth stacked body SB5.

In the fifth stacked body SB5, the third magnetic layer 13 which is the reference layer is provided between the first magnetic layer 11 and the second magnetic layer 12 which are the memory layers. The first nonmagnetic layer 16 is provided between the second magnetic layer 12 and the third magnetic layer 13. The first insulating layer 19 is provided between the third magnetic layer 13 and the first magnetic layer 11. Accordingly, in the fifth stacked body SB5, the second magnetic layer 12, the first nonmagnetic layer 16, the third magnetic layer 13, the first insulating layer 19, the first magnetic layer 11, the second nonmagnetic layer 17, and the fourth magnetic layer 14 are stacked in this order along the Z-direction in order from the first conductive layer 21 side. The second magnetic layer 12 contacts the first conductive layer 21. The fourth magnetic layer 14 is connected to the third terminal T3. Or, the configuration between the second magnetic layer 12 and the first magnetic layer 11 in the fifth stacked body SB5 may be a configuration such as that shown in FIG. 5.

Otherwise, the configuration and the operations of the modification are similar to those of the second embodiment.

Third Embodiment

Figure 10:
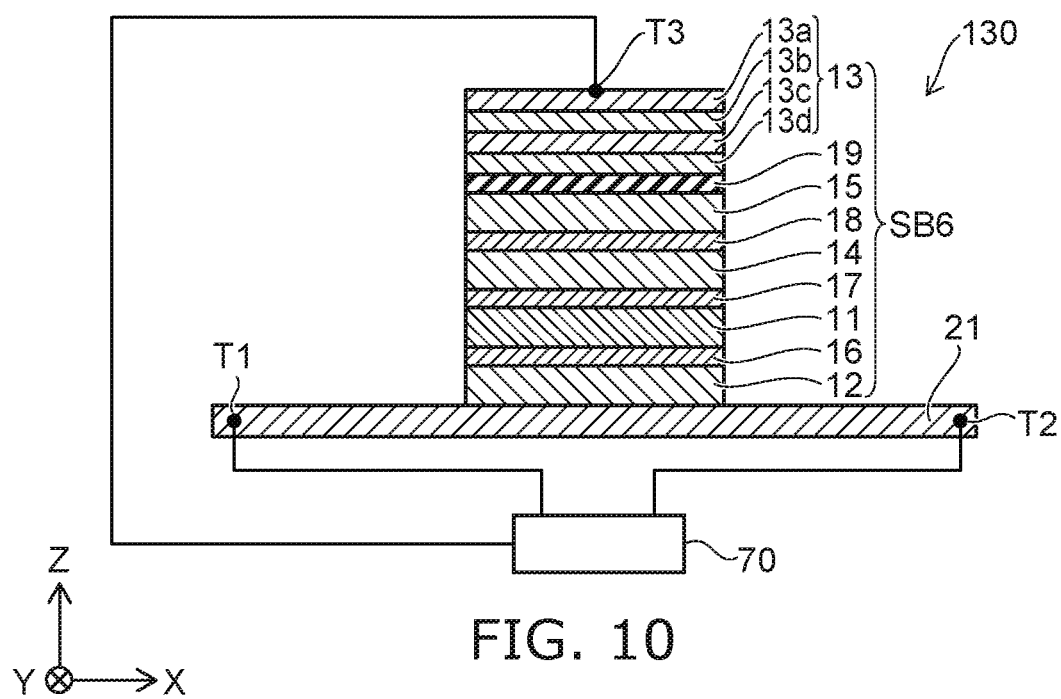
FIG. 10 is a cross-sectional view showing a magnetic memory device according to a third embodiment.

FIG. 10 is a cross-sectional view showing a magnetic memory device according to the embodiment.

In the magnetic memory device 130 according to the embodiment as shown in FIG. 10, a fifth magnetic layer 15 and a third nonmagnetic layer 18 are provided in addition to the configuration of the magnetic memory device 120 according to the second embodiment described above (referring to FIG. 6). The fifth magnetic layer 15 is provided between the fourth magnetic layer 14 and the third magnetic layer 13. The third nonmagnetic layer 18 is provided between the fourth magnetic layer 14 and the fifth magnetic layer 15.

In other words, in the embodiment, a sixth stacked body SB6 is provided instead of the third stacked body SB3 of the second embodiment; and in the sixth stacked body SB6, the second magnetic layer 12, the first nonmagnetic layer 16, the first magnetic layer 11, the second nonmagnetic layer 17, the fourth magnetic layer 14, the third nonmagnetic layer 18, the fifth magnetic layer 15, the first insulating layer 19, and the third magnetic layer 13 are stacked in this order along the Z-direction from the first conductive layer 21 side. The configuration of the third magnetic layer 13 is similar to that of the first embodiment (referring to FIG. 1B).

Operations of the embodiment will now be described.

In the sixth stacked body SB6, the fifth magnetic layer 15 is a free magnetic layer and functions as a memory layer. The controller 70 causes a current to flow between the first terminal T1 and the second terminal T2, and causes a current to flow between the first terminal T1 and the third terminal T3; and the electrical resistance value between the third terminal T3 and the first terminal T1 for the sixth stacked body SB6 changes according to the orientations and the magnitudes of these currents. The electrical resistance value changes between nine or more levels, e.g., sixteen levels; and the controller 70 can identify the sixteen levels of electrical resistance values. As a result, hexadecimal data can be stored in the sixth stacked body SB6.

Although the principle of the electrical resistance value of the sixth stacked body SB6 of the embodiment changing between the sixteen levels is not exactly clear, it is inferred, similarly to the first embodiment and the second embodiment described above, that the four magnetic layers are stacked; antiferromagnetic coupling and ferromagnetic coupling are caused; and the magnetization directions of the four magnetic layers as an entirety are split into sixteen directions by the competition between the magnetostatic field and the ferromagnetic coupling.

As described above, according to the embodiment, for example, hexadecimal data can be stored in the sixth stacked body SB6 included in one memory cell. Therefore, for example, the storage density of the magnetic memory device 130 according to the embodiment can be increased even more.

Otherwise, the configuration and the operations of the embodiment are similar to those of the second embodiment described above.

First Modification of Third Embodiment

Figure 11:
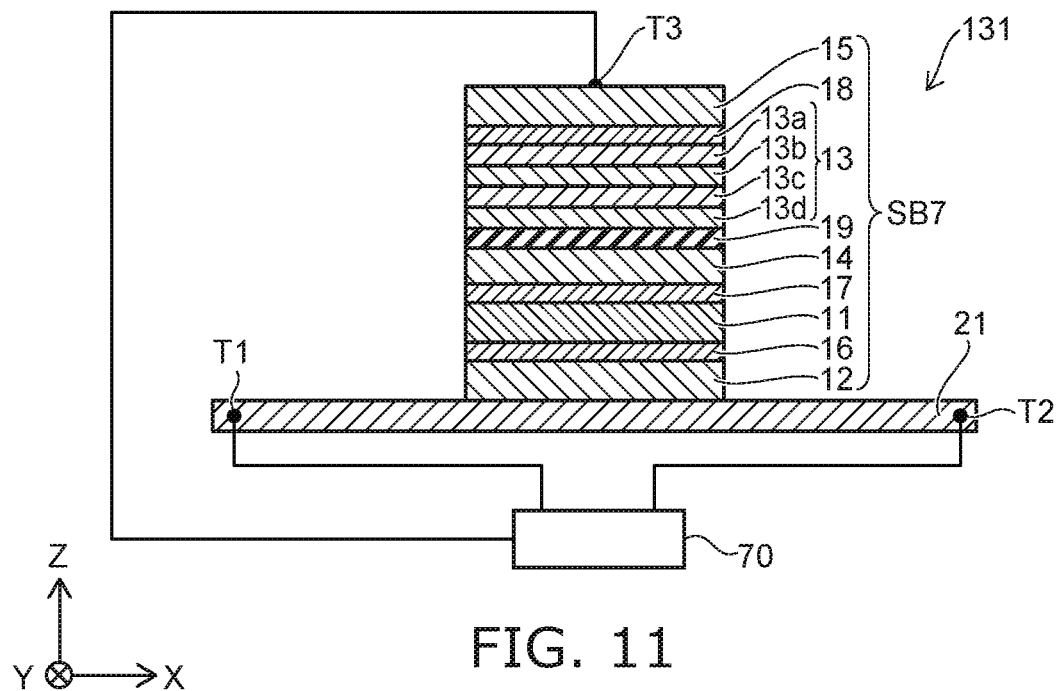
FIG. 11 is a cross-sectional view showing a magnetic memory device according to a first modification of the third embodiment.

FIG. 11 is a cross-sectional view showing a magnetic memory device according to the modification.

As shown in FIG. 11, compared to the magnetic memory device 130 according to the third embodiment described above (referring to FIG. 10), a seventh stacked body SB7 is provided instead of the sixth stacked body SB6 in the magnetic memory device 131 according to the modification. Compared to the sixth stacked body SB6, the position of the third magnetic layer 13 is different in the seventh stacked body SB7.

In the seventh stacked body SB7, the third magnetic layer 13 which is the reference layer is provided between the fifth magnetic layer 15 and the fourth magnetic layer 14 which are the memory layers. The third nonmagnetic layer 18 is provided between the third magnetic layer 13 and the fifth magnetic layer 15. The first insulating layer 19 is provided between the fourth magnetic layer 14 and the third magnetic layer 13.

Accordingly, in the seventh stacked body SB7, the second magnetic layer 12, the first nonmagnetic layer 16, the first magnetic layer 11, the second nonmagnetic layer 17, the fourth magnetic layer 14, the first insulating layer 19, the third magnetic layer 13, the third nonmagnetic layer 18, and the fifth magnetic layer 15 are stacked in this order along the Z-direction in order from the first conductive layer 21 side. The second magnetic layer 12 contacts the first conductive layer 21. The fifth magnetic layer 15 is connected to the third terminal T3. The configuration of the third magnetic layer 13 may be the configuration shown in FIG. 5.

Otherwise, the configuration and the operations of the modification are similar to those of the third embodiment.

Second Modification of Third Embodiment

Figure 12:
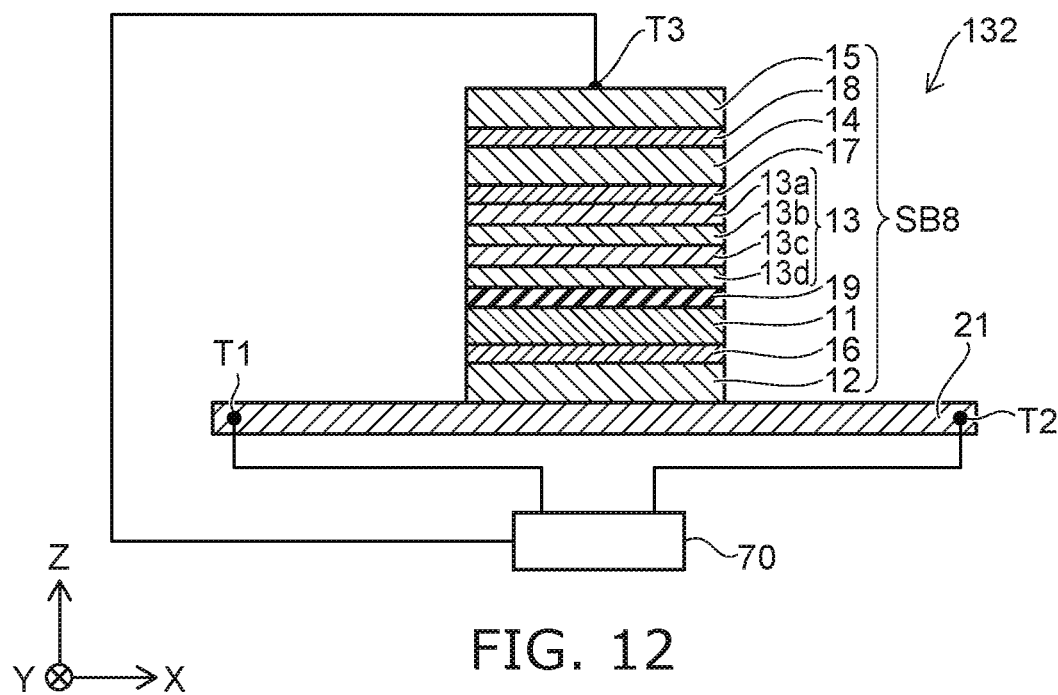
FIG. 12 is a cross-sectional view showing a magnetic memory device according to a second modification of the third embodiment.

FIG. 12 is a cross-sectional view showing a magnetic memory device according to the modification.

As shown in FIG. 12, compared to the magnetic memory device 130 according to the third embodiment described above (referring to FIG. 10), an eighth stacked body 588 is provided instead of the sixth stacked body SB6 in the magnetic memory device 132 according to the modification. Compared to the sixth stacked body SB6, the position of the third magnetic layer 13 is different in the eighth stacked body SB8.

In the eighth stacked body SB8, the third magnetic layer 13 which is the reference layer is provided between the fourth magnetic layer 14 and the first magnetic layer 11 which are the memory layers. The second nonmagnetic layer 17 is provided between the third magnetic layer 13 and the fourth magnetic layer 14. The first insulating layer 19 is provided between the first magnetic layer 11 and the third magnetic layer 13.

Accordingly, in the eighth stacked body SB8, the second magnetic layer 12, the first nonmagnetic layer 16, the first magnetic layer 11, the first insulating layer 19, the third magnetic layer 13, the second nonmagnetic layer 17, the fourth magnetic layer 14, the third nonmagnetic layer 18, and the fifth magnetic layer 15 are stacked in this order along the Z-direction in order from the first conductive layer 21 side. The second magnetic layer 12 contacts the first conductive layer 21. The fifth magnetic layer 15 is connected to the third terminal T3. The configuration of the third magnetic layer 13 may be the configuration shown in FIG. 5.

Otherwise, the configuration and the operations of the modification are similar to those of the third embodiment.

Third Modification of Third Embodiment

Figure 13:
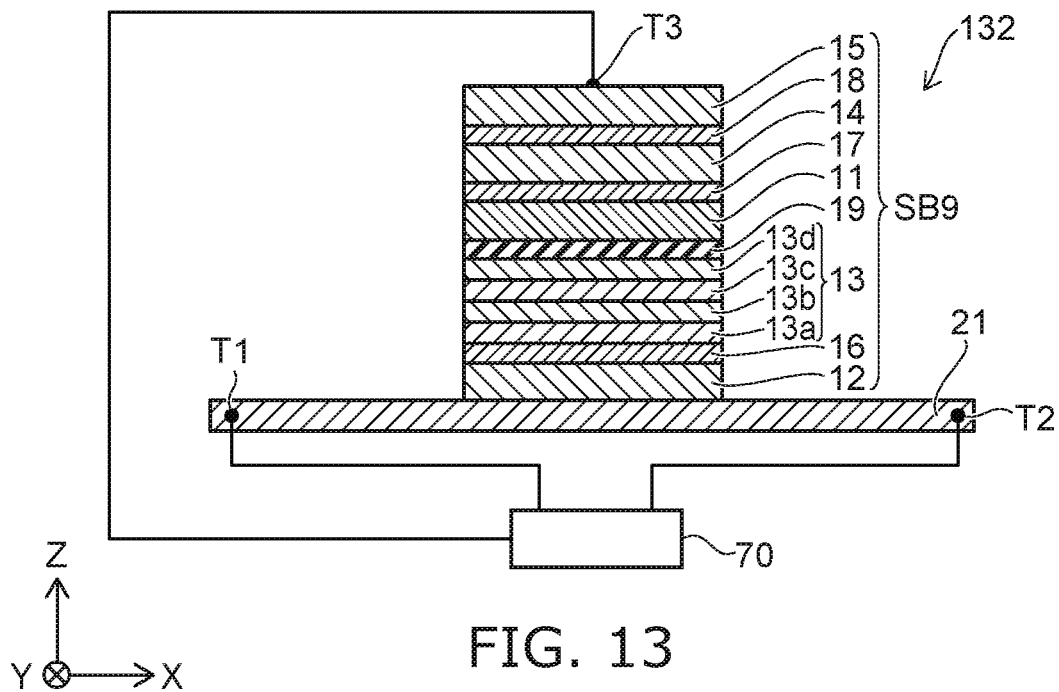
FIG. 13 is a cross-sectional view showing a magnetic memory device according to a third modification of the third embodiment.

FIG. 13 is a cross-sectional view showing a magnetic memory device according to the modification.

As shown in FIG. 13, compared to the magnetic memory device 130 according to the third embodiment described above (referring to FIG. 10), a ninth stacked body SB9 is provided instead of the sixth stacked body SB6 in the magnetic memory device 133 according to the modification. Compared to the sixth stacked body SB6, the position of the third magnetic layer 13 is different in the ninth stacked body SB9.

In the ninth stacked body SB9, the third magnetic layer 13 which is the reference layer is provided between the first magnetic layer 11 and the second magnetic layer 12 which are the memory layers. The first nonmagnetic layer 16 is provided between the third magnetic layer 13 and the first magnetic layer 11. The first insulating layer 19 is provided between the second magnetic layer 12 and the third magnetic layer 13.

Accordingly, in the ninth stacked body SB9, the second magnetic layer 12, the first insulating layer 19, the third magnetic layer 13, the first nonmagnetic layer 16, the first magnetic layer 11, the second nonmagnetic layer 17, the fourth magnetic layer 14, the third nonmagnetic layer 18, and the fifth magnetic layer 15 are stacked in this order along the Z-direction in order from the first conductive layer 21 side. The second magnetic layer 12 contacts the first conductive layer 21. The fifth magnetic layer 15 is connected to the third terminal T3. The configuration of the third magnetic layer 13 may be the configuration shown in FIG. 5.

Otherwise, the configuration and the operations of the modification are similar to those of the third embodiment.

Although examples of two to four memory layers are shown in the first to third embodiments and their modifications described above, this is not limited thereto. The number of memory layers can be N (N being an integer of 2 or more). In such a case, it is predicted that the magnetization directions can be split into $2^N$ directions by the competition between the ferromagnetic coupling and the magnetostatic field. Thereby, the electrical resistance value along the stacking direction of the stacked body can have $2^N$ values; and in principle, $2^N$-ary data can be stored in one stacked body.

The magnetization directions of the memory layers in the first to third embodiments and their modifications are not limited to film in-plane directions and may have magnetization components in film surface perpendicular directions.

Fourth Embodiment

Figure 14:
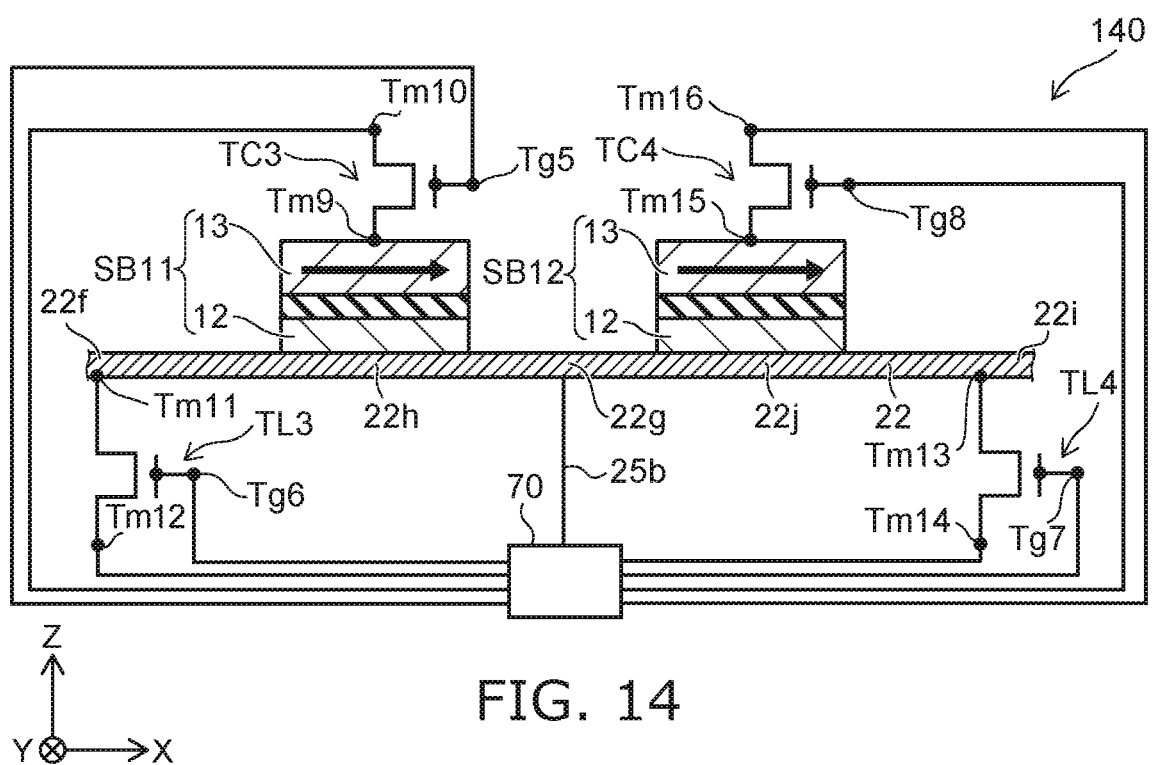
FIG. 14 is a cross-sectional view showing a magnetic memory device according to a fourth embodiment.

FIG. 14 is a cross-sectional view showing a magnetic memory device according to the embodiment.

The embodiment is an example in which two stacked bodies are integrated.

As shown in FIG. 14, the magnetic memory device 140 according to the embodiment includes a second conductive layer 22, an eleventh stacked body SB11, a twelfth stacked body SB12, and the controller 70. The configurations of the eleventh stacked body SB11 and the twelfth stacked body SB12 are, for example, the same as that of the first stacked body SB1 of the first embodiment (referring to FIG. 1B). Any of the second to ninth stacked bodies SB2 to SB9 described above may be used as the eleventh stacked body SB11 and the twelfth stacked body SB12. For convenience of illustration, only the second magnetic layer 12 which is the memory layer and the third magnetic layer 13 which is the reference layer of each stacked body are illustrated in FIG. 14; and the other layers are not illustrated.

The second conductive layer 22 includes fourth to eighth regions 22f to 22j. The fifth region 22g is provided between the fourth region 22f and the seventh region 22i in the X-direction. The eighth region 22j is provided between the fifth region 22g and the seventh region 22i.

The controller 70 is electrically connected to the seventh region 22i and the third magnetic layer 13 of the twelfth stacked body SB12. A third cell transistor TC3, a fourth cell transistor TC4, a third conductive layer transistor TL3, a fourth conductive layer transistor TL4, and a middle interconnect 25 are further provided in the example.

The third cell transistor TC3 includes a ninth end portion Tm9, a tenth end portion Tm10, and a fifth gate Tg5. The third conductive layer transistor TL3 includes an eleventh end portion Tm11, a twelfth end portion Tm12, and a sixth gate Tg6. The fourth conductive layer transistor TL4 includes a thirteenth end portion Tm13, a fourteenth end portion Tm14, and a seventh gate Tg7. The fourth cell transistor TC4 includes a fifteenth end portion Tm15, a sixteenth end portion Tm16, and an eighth gate Tg8.

The ninth end portion Tm9 is electrically connected to the third magnetic layer 13 of the eleventh stacked body SB11. The tenth end portion Tm10 and the fifth gate Tg5 are electrically connected to the controller 70. The eleventh end portion Tm11 is electrically connected to the fourth region 22f. The twelfth end portion Tm12 and the sixth gate Tg6 are electrically connected to the controller 70. The thirteenth end portion Tm13 is electrically connected to the seventh region 22i. The fourteenth end portion Tm14 and the seventh gate Tg7 are electrically connected to the controller 70. The fifteenth end portion Tm15 is electrically connected to the third magnetic layer 13 of the twelfth stacked body SB12. The sixteenth end portion Tm16 and the eighth gate Tg8 are electrically connected to the controller 70. A second middle interconnect 25b is electrically connected to the fifth region 22g.

For example, the tenth end portion Tm10 is set to a Vdd voltage; and the twelfth end portion Tm12 is set to a Vss voltage. Or, the tenth end portion Tm10 is set to the Vss voltage; and the twelfth end portion Tm12 is set to the Vdd voltage. At this time, for example, the fifth region 22g is set to the voltage of "Vdd/2."

For example, the sixteenth end portion Tm16 is set to the Vdd voltage; and the fourteenth end portion Tm14 is set to the Vss voltage. Or, the sixteenth end portion Tm16 is set to the Vss voltage; and the fourteenth end portion Tm14 is set to the Vdd voltage. At this time, for example, the fifth region 22g is set to the voltage of "Vdd/2."

Otherwise, the configuration and the operations of the embodiment are similar to those of the first embodiment described above.

Fifth Embodiment

Figure 15A:
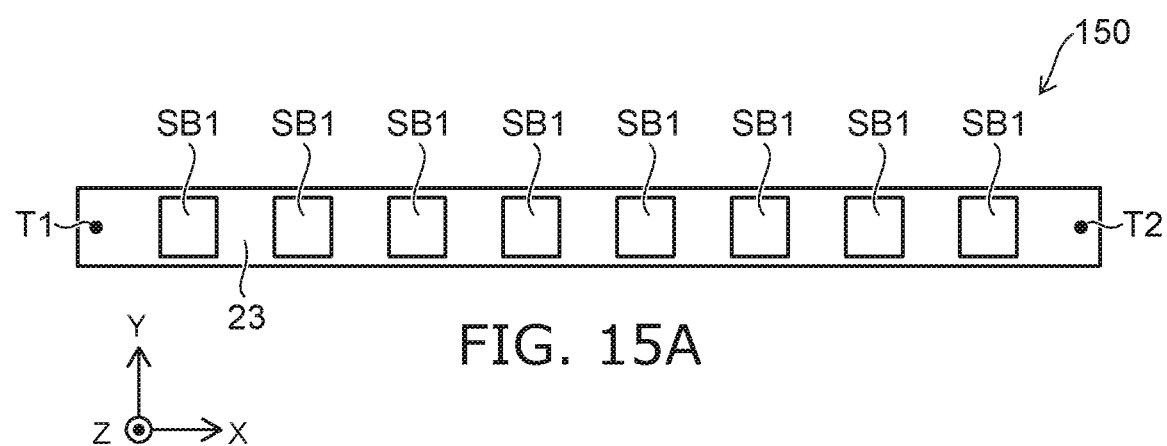
FIG. 15A is a plan view illustrating a magnetic memory device according to a fifth embodiment.
Figure 15B:
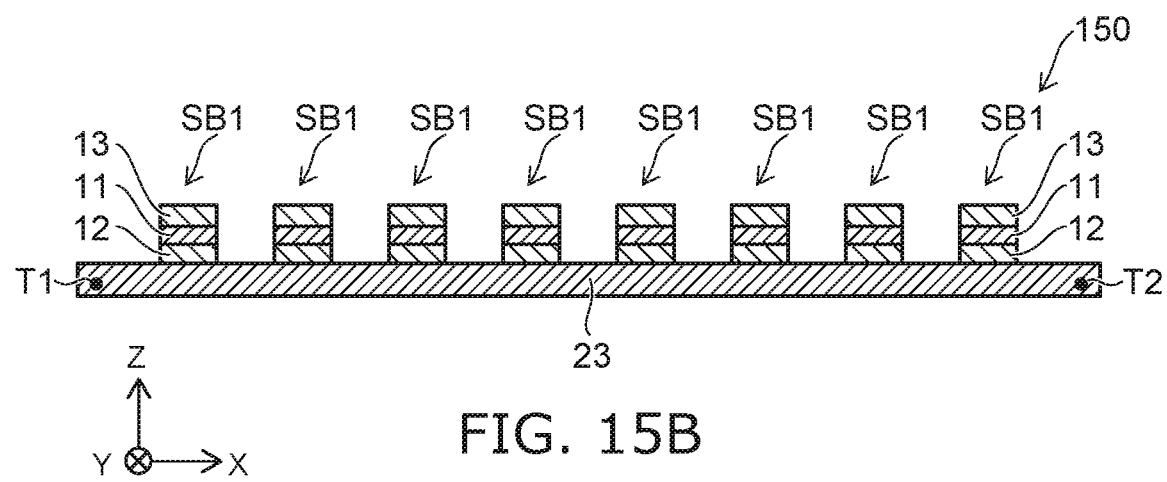
FIG. 15B is a cross-sectional view of the magnetic memory device.

FIG. 15A is a plan view illustrating a magnetic memory device according to the embodiment; and FIG. 15B is a cross-sectional view of the magnetic memory device.

The embodiment is an example in which multiple, e.g., eight stacked bodies are integrated.

As shown in FIGS. 15A and 15B, a third conductive layer 23 is provided in the magnetic memory device 150 according to the embodiment. The configuration of the third conductive layer 23 is a band configuration extending in the X-direction. In the magnetic memory device 150, multiple, e.g., eight first stacked bodies SB1 are provided in contact with the third conductive layer 23. The eight first stacked bodies SB1 are arranged in one column along the X-direction.

The configuration of each of the first stacked bodies SB1 is as described in the first embodiment described above (referring to FIGS. 1A and 16). The second magnetic layer 12 and the first nonmagnetic layer 16 (referring to FIG. 1B), the first magnetic layer 11 and the first insulating layer 19 (referring to FIG. 1B), and the third magnetic layer 13 are provided in each of the first stacked bodies SB1.

The second magnetic layer 12 of each of the first stacked bodies SB1 contacts the third conductive layer 23. The third magnetic layer 13 of each of the first stacked bodies SB1 is connected to the controller 70 (referring to FIG. 1B) via the third terminal T3 (referring to FIG. 1B). The two end portions of the third conductive layer 23 also are connected to the controller 70 via the first terminal T1 and the second terminal T2. The first stacked body SB1 is provided between the first terminal T1 and the second terminal T2 in the X-direction.

According to the embodiment, for example, highly-integrated memory cells can be realized by connecting the multiple first stacked bodies SB1 to one third conductive layer 23.

Otherwise, the configuration and the operations of the embodiment are similar to those of the first embodiment described above.

According to the embodiments described above, a magnetic memory device can be realized in which the storage density can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A magnetic memory device, comprising:
a conductive member;
a stacked body; and
a controller,
the stacked body including
a first magnetic layer,
a second magnetic layer provided between the conductive member and the first magnetic layer, and
a third magnetic layer stacked with the first magnetic layer and the second magnetic layer,
the controller causing a current to flow in the conductive member, causing a current to flow between the conductive member and the stacked body, and being able to identify three or more levels of an electrical resistance value of the stacked body,
wherein one of the first magnetic layer or the second magnetic layer includes a material having negative magnetostriction, and
the other of the first magnetic layer or the second magnetic layer includes a material having positive magnetostriction.

2. The device according to claim 1, wherein the first magnetic layer and the second magnetic layer are provided between the conductive member and the third magnetic layer.

3. The device according to claim 1, wherein the third magnetic layer is provided between the first magnetic layer and the second magnetic layer.

4. The device according to claim 1, wherein the stacked body further includes a nonmagnetic layer provided between the first magnetic layer and the second magnetic layer.

5. The device according to claim 4, wherein the nonmagnetic layer includes at least one type of metal selected from the group consisting of ruthenium, iridium, chrome, and rhodium.

6. The device according to claim 1, wherein the stacked body further includes an insulating layer provided between the second magnetic layer and the third magnetic layer.

7. The device according to claim 6, wherein the insulating layer includes at least one type of material selected from the group consisting of magnesium oxide, aluminum oxide, and magnesium-aluminum oxide.

8. The device according to claim 1, wherein
the material having negative magnetostriction is an iron-cobalt alloy having a fcc structure, and
the material having positive magnetostriction is an iron-cobalt alloy having a bcc structure.

9. The device according to claim 1, wherein
the stacked body further includes a fourth magnetic layer,
the fourth magnetic layer is stacked with the first magnetic layer, the second magnetic layer, and the third magnetic layer, and
the controller can identify five or more levels of an electrical resistance value along a stacking direction of the stacked body.

10. The device according to claim 9, wherein
the stacked body further includes a fifth magnetic layer,
the fifth magnetic layer is stacked with the first magnetic layer, the second magnetic layer, the third magnetic layer, and the fourth magnetic layer, and
the controller can identify nine or more levels of the electrical resistance value along the stacking direction of the stacked body.

11. The device according to claim 1, wherein a magnetization direction of a multilayer memory layer including the first magnetic layer and the second magnetic layer can be in three or more directions.

12. A magnetic memory device, comprising:
a conductive member; and
a stacked body connected to the conductive member,
the stacked body including
a first magnetic layer including at least one type of metal selected from the group consisting of iron, cobalt, and nickel,
a second magnetic layer including at least one type of metal selected from the group consisting of iron, cobalt, and nickel and being provided between the conductive member and the first magnetic layer, and
a third magnetic layer stacked with the first magnetic layer and the second magnetic layer,
wherein one of the first magnetic layer or the second magnetic layer includes a material having negative magnetostriction, and
the other of the first magnetic layer or the second magnetic layer includes a material having positive magnetostriction.

13. The device according to claim 12, wherein
the third magnetic layer includes:
a first ferromagnet layer including a ferromagnet or an alloy of the ferromagnet, the ferromagnet including an iron-cobalt alloy as a major component, the alloy including the ferromagnet and at least one type of component selected from the group consisting of boron, silicon, aluminum, germanium, gallium, and carbon;

a nonmagnetic layer including at least one type of metal selected from the group consisting of ruthenium, iridium, chrome, and rhodium;

a second ferromagnet layer including a cobalt-iron alloy; and an antiferromagnet layer including an alloy, the alloy including manganese and at least one type of metal selected from the group consisting of iridium, rhodium, platinum, and iron.

14. The device according to claim 12, wherein a magnetization direction of a multilayer memory layer including the first magnetic layer and the second magnetic layer can be in three or more directions.

* * * * *